(12) United States Patent
Gao

(10) Patent No.: US 11,700,714 B2
(45) Date of Patent: Jul. 11, 2023

(54) INTEGRATED IMMERSION SYSTEM FOR SERVERS

(71) Applicant: Baidu USA LLC, Sunnyvale, CA (US)

(72) Inventor: Tianyi Gao, San Jose, CA (US)

(73) Assignee: BAIDU USA LLC, Sunnyvale, CA (US)

( * ) Notice: Subject to any disclaimer, the term of this patent is extended or adjusted under 35 U.S.C. 154(b) by 128 days.

(21) Appl. No.: 17/409,992

(22) Filed: Aug. 24, 2021

(65) Prior Publication Data

US 2023/0068585 A1 Mar. 2, 2023

(51) Int. Cl.
H05K 7/20 (2006.01)

(52) U.S. Cl.
CPC ......... *H05K 7/20809* (2013.01); *H05K 7/203* (2013.01); *H05K 7/20318* (2013.01); *H05K 7/20327* (2013.01)

(58) Field of Classification Search
CPC ............... H05K 7/20236; H05K 7/203; H05K 7/20272; H05K 7/20781; H05K 7/20818; H05K 7/20318; H05K 7/20281; H05K 7/208; H05K 1/0203; H05K 5/023; H05K 5/0217; H05K 7/1487; H05K 7/20636; G06F 1/20; G06F 2200/201; G06F 1/181; H01L 23/44; H01L 23/473; H01L 23/32; F28D 1/0213; F28D 2021/0028
USPC ........................ 165/104.33; 361/679.53, 727
See application file for complete search history.

(56) References Cited

U.S. PATENT DOCUMENTS

| | | | | |
|---|---|---|---|---|
| 11,412,636 B2* | 8/2022 | Kuo | ...................... | F28D 1/0206 |
| 2016/0240226 A1* | 8/2016 | Shelnutt | .................. | H05K 7/203 |
| 2018/0084671 A1* | 3/2018 | Matsumoto | ........ | H05K 7/20772 |
| 2021/0410320 A1* | 12/2021 | Yang | .................. | H05K 7/20327 |
| 2022/0087050 A1* | 3/2022 | Jia | ...................... | H05K 7/20809 |
| 2022/0322572 A1* | 10/2022 | Chehade | .................. | G06F 1/20 |
| 2022/0361381 A1* | 11/2022 | Sweeney | ............ | H05K 7/20836 |
| 2023/0023554 A1* | 1/2023 | Jian | .................... | H05K 7/20327 |
| 2023/0026658 A1* | 1/2023 | Lin | .................... | H05K 7/20318 |

* cited by examiner

*Primary Examiner* — Mandeep S Buttar
(74) *Attorney, Agent, or Firm* — Womble Bond Dickinson (US) LLP

(57) ABSTRACT

According to one embodiment, an immersion cooling system may include a container to receive one or more server blades, each having electronics, at least partially submerged within a two-phase coolant contained within the container. The immersion cooling system may also include a cover panel to cover the phase change area. This area may include a liquid region defined to contain the two-phase coolant therein, and a vapor region defined between the cover panel and a surface of the two-phase coolant. The cover panel includes a plurality of slots, covered with rotatable panels. At least one of the slots is configured to allow a server blade to be inserted into the liquid region and at least partially submerged into the two-phase coolant. The slots may be configured to allow a condensing unit to be inserted into the vapor region.

20 Claims, 9 Drawing Sheets

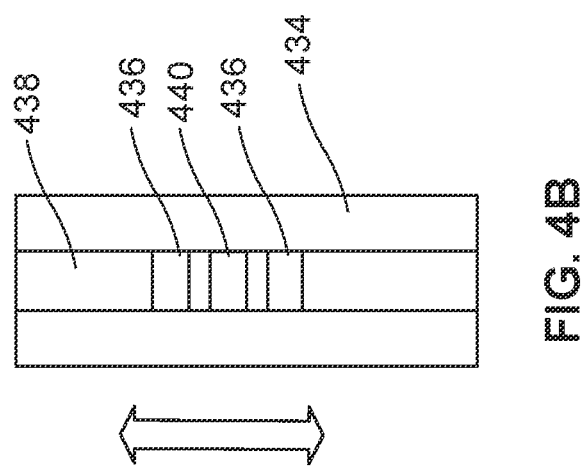

INTEGRATED IMMERSION SYSTEM FOR SERVERS

FIELD

Embodiments of the present disclosure relate generally to an integrated immersion system for immersion cooled information technology (IT) equipment.

BACKGROUND

Thermal management for a data center that includes several active electronic racks is critical to ensure proper performance of servers and other IT equipment (e.g., performing IT services) that is operating in the racks. Without proper thermal management, however, the thermal environment (e.g., temperature) within the racks may exceed thermal operational thresholds, which may result in adverse consequences (e.g., servers failing, etc.). One way to manage the thermal environment is the use of cooling air to cool the IT equipment. The cooling air is recirculated through cooling units. Heat generated by the IT equipment is captured by the cooling air and is extracted by the cooling unit. There are many existing air cooling solutions for data centers with a primary function to supply cooling air to a room, remove hot air from the room, and process the hot air back to the cooling air.

Recently, data centers have been deploying more high-power density electronic racks, where more high-density chips are packaged closer together to provide more processing power. Cooling these high-density racks by maintaining a proper thermal environment may be an issue with existing cooling systems, such as a computer room air conditioning (CRAC) unit. For instance, although the CRAC unit may maintain the thermal environment with more conventional (or lower-density) racks, the unit may be unable to effectively cool high-power density racks because they may generate heat load at a higher rate due to the higher density electronics. Or it may be costly to upgrade a CRAC system to satisfy a cooling requirement of a high density deployment. Another challenge for air cooling high density racks is moving a large amount of airflow sufficient to cool the racks.

Immersion cooling, on the other hand, which involves at least partially submerging electronics in a dielectric solution is a feasible solution for high-density electronics. Implementing immersion cooling in existing data centers, however, has challenges.

The existing two-phase immersion cooling system design lacks a design consideration for electronics reliability and fluid loss, as well as system resilience for different power density requirements. For example, the existing system design lacks a design consideration that may prevent fluid loss or vapor escaping from the system during a maintenance of a server (e.g., changing a hard drive).

BRIEF DESCRIPTION OF THE DRAWINGS

The aspects are illustrated by way of example and not by way of limitation in the figures of the accompanying drawings in which like references indicate similar elements. It should be noted that references to "an" or "one" aspect of this disclosure are not necessarily to the same aspect, and they mean at least one. Also, in the interest of conciseness and reducing the total number of figures, a given figure may be used to illustrate the features of more than one aspect, and not all elements in the figure may be required for a given aspect.

FIG. 4B is a block diagram illustrating front perspective view of an example of a mounting set according to one embodiment.

DETAILED DESCRIPTION

Figure 1:
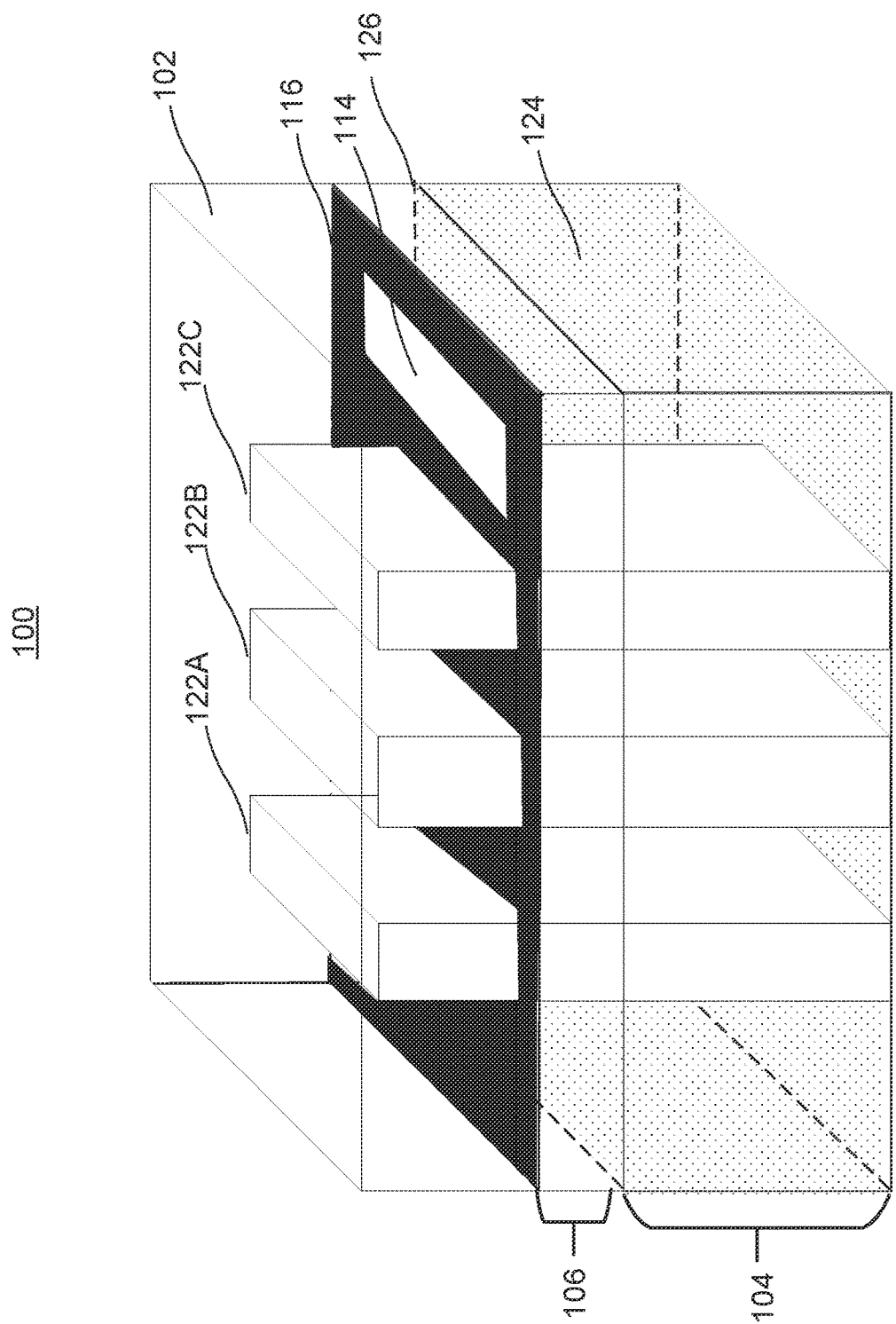
FIG. 1 is a block diagram illustrating perspective view of an example of an immersion cooling system according to one embodiment.

Several aspects of the disclosure with reference to the appended drawings are now explained. Whenever the shapes, relative positions and other aspects of the parts described in a given aspect are not explicitly defined, the scope of the disclosure here is not limited only to the parts shown, which are meant merely for the purpose of illustration. Also, while numerous details are set forth, it is understood that some aspects may be practiced without these details. In other instances, well-known circuits, structures, and techniques have not been shown in detail so as not to obscure the understanding of this description. Furthermore, unless the meaning is clearly to the contrary, all ranges set forth herein are deemed to be inclusive of each range's endpoints.

Reference in the specification to "one embodiment" or "an embodiment" means that a particular feature, structure, or characteristic described in conjunction with the embodiment can be included in at least one embodiment of the disclosure. The appearances of the phrase "in one embodiment" in various places in the specification do not necessarily all refer to the same embodiment.

The present disclosure solves the problems described above by providing an immersion cooling system including a two-phase immersion cooling container for operating two phase cooling for servers, thereby supporting the dynamic changes of heat generation and configuration variations. The embodiments of the present disclosure herein describe implementations of an immersion cooling system that cools heat-generating electronics. The immersion cooling system also includes a condensing set having a main condensing unit. The panel of the condensing set is configured to include a number of slots to receive server blades or localized condensing units. The panel of the condensing unit may include rotation lids, where each rotation lid opens downwardly when either the server blade or the local condensing unit is inserted downwardly. The configuration of the server blade and the condensing coil together with the panel of the condensing set provide a separate environment for the electronics submerged in the coolant by segregating the vapor region from the external environment (i.e., either the air region on top of the panel when the lid is closed, or the entire external air region).

According to one embodiment, an immersion cooling system includes a container to receive one or more server blades, which are at least partially submerged within a two-phase coolant contained within the container. Each server blade has electronics therein, such as, for example, a processor, a memory, and/or a peripheral device, etc. While the electronics operate, the electronics generate heat that is transferred into the two-phase coolant thereby causing at least some of the two-phase coolant to turn into a vapor. The immersion cooling system additionally includes a cover panel (e.g., a top cover) to cover the container. The container includes a liquid region defined to contain the two-phase coolant therein, and a vapor region defined between the cover panel and a surface of the two-phase coolant. The cover panel includes a plurality of slots. At least one of the slots is configured to allow a server blade to be inserted into the liquid region and at least partially submerged into the two-phase coolant. In addition, at least one of the slots is configured to allow a condensing unit to be inserted into the vapor region.

In one embodiment, the condensing unit is positioned and integrated below the cover panel and within the vapor region, the condensing unit being configured to condense the vapor back into the two-phase coolant.

In one embodiment, the container further includes a fluid level sensor positioned within the liquid region and configured to detect a fluid level of the two-phase coolant in the liquid region and maintain a predefined fluid level, a pump electrically connected to the fluid level sensor, for example, via a controller, and configured to receive a control signal to control the pump speed based on the fluid level of the two-phase coolant in the liquid region indicated by the fluid level sensor. Further, a return line and a supply line that are both coupled to the container to release and supply the two-phase coolant, respectively. The pump is coupled to the return line or the supply line, and configured to release the two-phase coolant through the return line and to fill the liquid region through the supply line with the two-phase coolant so as to maintain the predefined fluid level of the two-phase coolant in the liquid region based on the signal.

In one embodiment, the cover panel further includes a rotating lid configured to cover the plurality of slots and to provide a sealed environment to the electronics when the rotating lid is in a closed position. The rotating lid is configured to be in an open position when the server blade is inserted into the liquid region through one of the plurality of slots. The cover panel and a panel of the server blade provides the sealed environment to the electronics when the rotating lid is in the open position.

In one embodiment, the condensing unit includes a panel pushing a rotating lid to open when the condensing unit is inserted into the vapor region, thereby separating the air region and the vapor region.

In one embodiment, the container further includes a mounting set having a first portion positioned within the vapor region and fixedly coupled to the container, and a second portion coupled to the first portion and adjustable along a longitudinal axis of the first portion. The second portion is configured to hold and lock the cover panel, wherein the second portion is adjustable to adjust a height of the vapor region. The mounting set is adjustable based on a height of the condensing unit to avoid the condensing unit to be submerged in the two-phase coolant when the cover panel is installed in the container.

In one embodiment, the slots are configured to provide a separation in space between the server blades and/or the condensing units (also referred to as condensers). In one embodiment, the cover panel further includes one or more central condensing units and one or more local condensing units.

According to another embodiment, a data center including a plurality of containers to receive one or more server blades, at least partially submerged within a two-phase coolant contained within the container. Each server blade has electronics mounted therein to form one or more servers. While the electronics operate, the electronics generate heat that is transferred into the two-phase coolant thereby causing at least some of the two-phase coolant to turn into a vapor. Each container includes a liquid region defined to contain the two-phase coolant therein as previously described. Specifically, a vapor region defined between the cover panel and a surface of the two-phase coolant, wherein the cover panel includes a plurality of slots, wherein at least one of the slots is configured to allow a server blade to be inserted into the liquid region and at least partially submerged into the two-phase coolant, and wherein at least one of the slots is configured to allow a condensing unit to be inserted into the vapor region.

A system, as discussed above, in accordance with embodiments may provide a high efficient fluid operation, with ease of deployment and operation. The immersion cooling system can accommodate different types of server configurations. Consequently, an immersion cooling system in accordance with embodiments disclosed herein may accommodate different types of data center environments and configurations. The embodiments described herein may provide expandability for different power densities and cooling requirements. In addition, the current design described herein may enable modular design with high resilience.

FIG. 1 is a block diagram illustrating perspective view of an example of an immersion cooling system 100. Specifically, FIG. 1 shows an immersion cooling system 100 (which hereafter may be referred to as cooling system) that is configured to immersion cool a plurality of computing devices. The cooling system 100 can include a container 102 to contain a two-phase coolant 124 and a cover panel 116 to cover the container 102 A portion of the container 102 may be filled with an engineered fluid, e.g., two-phase coolant 124. The container 102 can be an immersion tank. In one embodiment, the container 102 may be a sealed tank and formed from one type of material (e.g., an alloy, etc.). The container 102 may be configured to receive one or more server blades 122A-122C. Each server blade has electronics therein representing one or more servers. Each of the one or more server blades 122A-122C, when inserted, may be at least partially submerged within a two-phase coolant 124 contained within the container 102. While the electronics operate, the electronics generate heat that is transferred into the two-phase coolant 124 thereby causing at least some of the two-phase coolant to turn into a vapor. The container 102 may include a liquid region 104 defined to contain the two-phase coolant 124 therein, and a vapor region 106 defined between the cover panel 116 and a surface 126 of the two-phase coolant 124.

The cover panel 116 in the cooling system 100 may include a plurality of slots 114. At least one of the slots 114 is configured to allow a server blade (e.g., 122A) to be inserted into the liquid region 104 and at least partially submerged into the two-phase coolant 124. In one embodiment, one or more of the slots 114 is configured to allow a condensing unit to be inserted into the vapor region. It should be noted that one of the slots 114 shown only represents the location where the server blade and/or localized condensing unit being populated. One of the slots 114 will be blocked either by the panels on the main panel 116 when no any IT equipment installed, or replaced by the IT equipment internal panel once IT equipment is populated.

The plurality of computing devices disposed in container 102 may include any type and quantity of devices. The plurality of computing devices may include computing devices that are part of a data center. The one or more server blades 110A-110C may include a printed circuit board (PCB) with electronic components mounted on them.

Two-phase liquid immersion cooling process allows heat to transfer by an evaporation and a condensation. Two-phase liquid immersion cooling process can be implemented by the cooling system 100 described herein. The two-phase coolant 116 that comes into contact with the server blade 122A having electronic components (e.g., central processing unit (CPU) Application-Specific Integrated Circuit (ASIC), or graphics processing unit (GPU)), may boil the two-phase coolant 124 and the heat may evaporate into a vapor. A condensing unit (not shown) may be inserted into the vapor region 124 through one of the slots 114. The vapor will then condense on the condensing unit and the vapor rains back to the fluid bath represented by the liquid region 104. Through this process of evaporation and condensation, the heat from the electronic components of the server blade is dissipated.

Through the two-phase liquid immersion cooling process implemented by the cooling system 100 described above, the server blade 110A having electronic components (e.g., CPU or GPU) can operate at temperatures a lot higher than the normal air cooling. The cooling system 100 allows the server blade 122A to run at greater speeds to achieve higher performance while reducing power and energy consumption. In addition, the server blade 122A can be packaged a lot closer and a lot more server blade 110A can be installed within the same space (e.g., a data center) ensuring a high density server blade within the cooling system 100 in a data center. Through this two-phase liquid immersion cooling process, computing power densities can be multiplied while physical size can be reduced, and the operating thermal environment can be maintained.

As illustrated in FIG. 1, the container 102 is configured to hold one or more server blades 122A-122C and two-phase coolant 124. As shown, inside the container 102 are several (in this example, three) server blades 122A-122C, which when inserted, are at least partially submerged in a two-phase coolant 124. As described herein, the container 102 includes one or more pieces of server blades 122A-122C. Thus, the container 102 may be sized differently in order to accommodate more (or less) pieces of server blades. While illustrated in FIG. 1 as included a limited number of specific components, a system in accordance with one or more embodiments may include fewer, additional, and/or different components.

Figure 2:
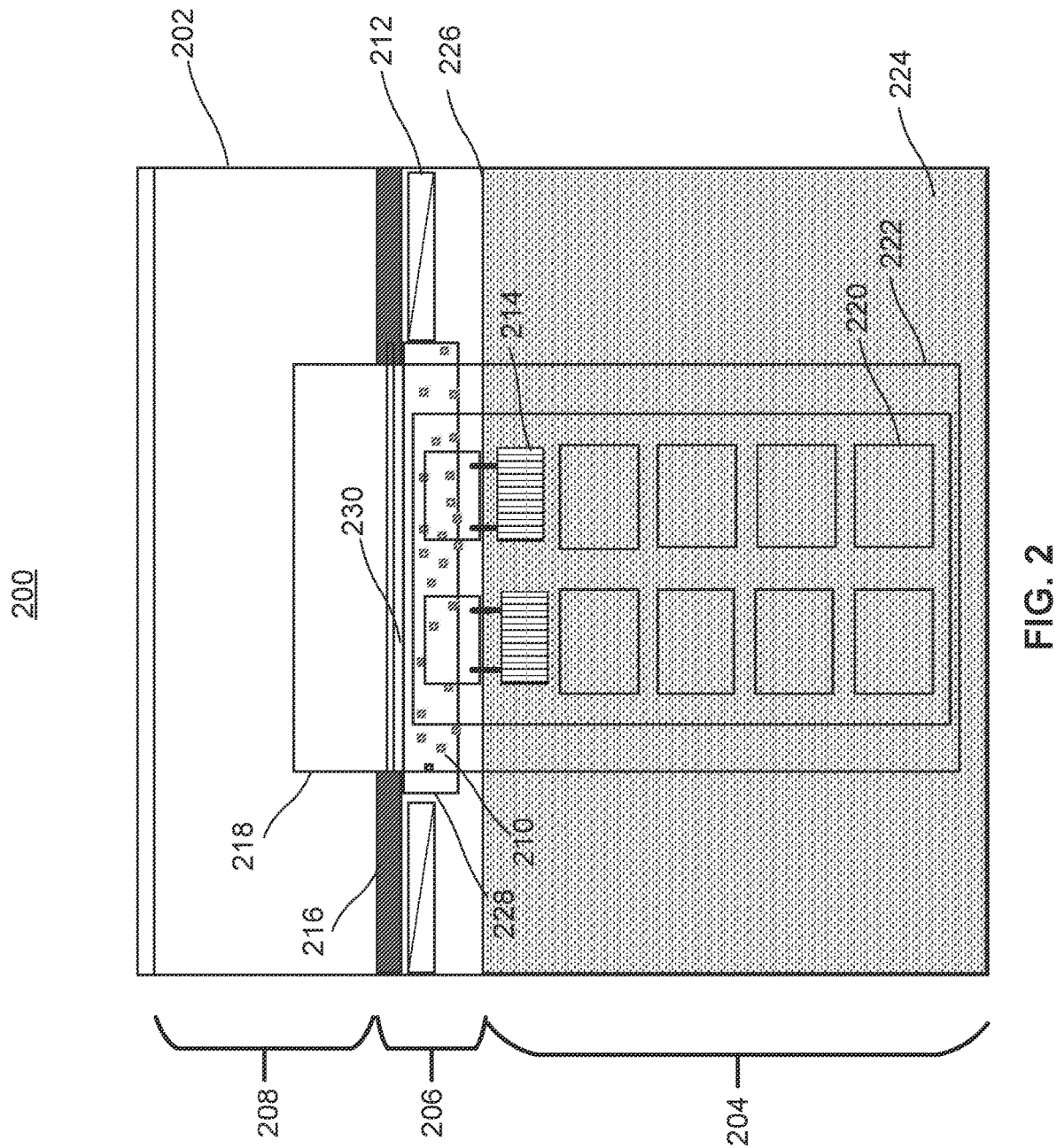
FIG. 2 is a block diagram illustrating side perspective view of an example of an immersion cooling system with a server blade installed according to one embodiment.

FIG. 2 is a block diagram illustrating side perspective view of an example of an immersion cooling system 200 with a server blade installed according to another embodiment. The immersion cooling system 200 may represent the cooling system 100 as described above. FIG. 2 can be understood as a side view of the immersion tank. Referring to FIG. 2, cooling system 200 may include a container 202 to receive one or more server blades 222, at least partially submerged within a two-phase coolant 224 contained within the container 202. Each server blade has electronics 220 representing one or more servers therein. While the electronics 220 operate, the electronics 220 generate heat that is transferred into the two-phase coolant 224 thereby causing at least some of the two-phase coolant 224 to turn into a vapor 210.

As shown, the cooling system 200 may also include a cover panel 216 to cover the container 202. The container 202, for example, may include a liquid region 204 defined to contain the two-phase coolant 224 therein, and a vapor region 206 defined between the cover panel 216 and a surface 226 of the two-phase coolant 224. The cover panel 216 includes a plurality of slots. At least one of the slots is configured to allow a server blade 222 to be inserted into the liquid region 204 and at least partially submerged into the two-phase coolant 224. At least one of the slots is configured to allow a condensing unit 212 to be inserted into the vapor region 206. In one embodiment, each of the slots has the same or similar shape or dimension to allow a server blade or a condensing unit to be inserted therethrough downwardly.

In one embodiment, the condensing unit 212 is positioned below the cover panel 216 and stays within the vapor region 206 and above the liquid region 204. The condensing unit 212 is located above the two-phase coolant 224. The condensing unit 212 is configured to condense the vapor 210 back into the two-phase coolant 224.

Still referring to FIG. 2, the immersion cooling system 200 further includes a remote cooler 214 to be positioned in a predefined location in the liquid region 204 such that the remote cooler 214 is at least completely submerged within the two-phase coolant 224. The remote cooler 214 is thermally coupled to the condensing unit 212. The remote cooler 214 is configured to receive heat from the electronics of a server blade that are located within vapor region 206, and the received heat is extracted into the two-phase coolant 224 within liquid region 204. The cover panel 216 which is the main panel also includes a rotating lid 228. The server blade may also include a built-in panel 230 that may cover one of the slots when the server blade 222 is inserted into the liquid region 204. The cover panel 216 is also used as the main base for assembling condensing units.

Figure 3:
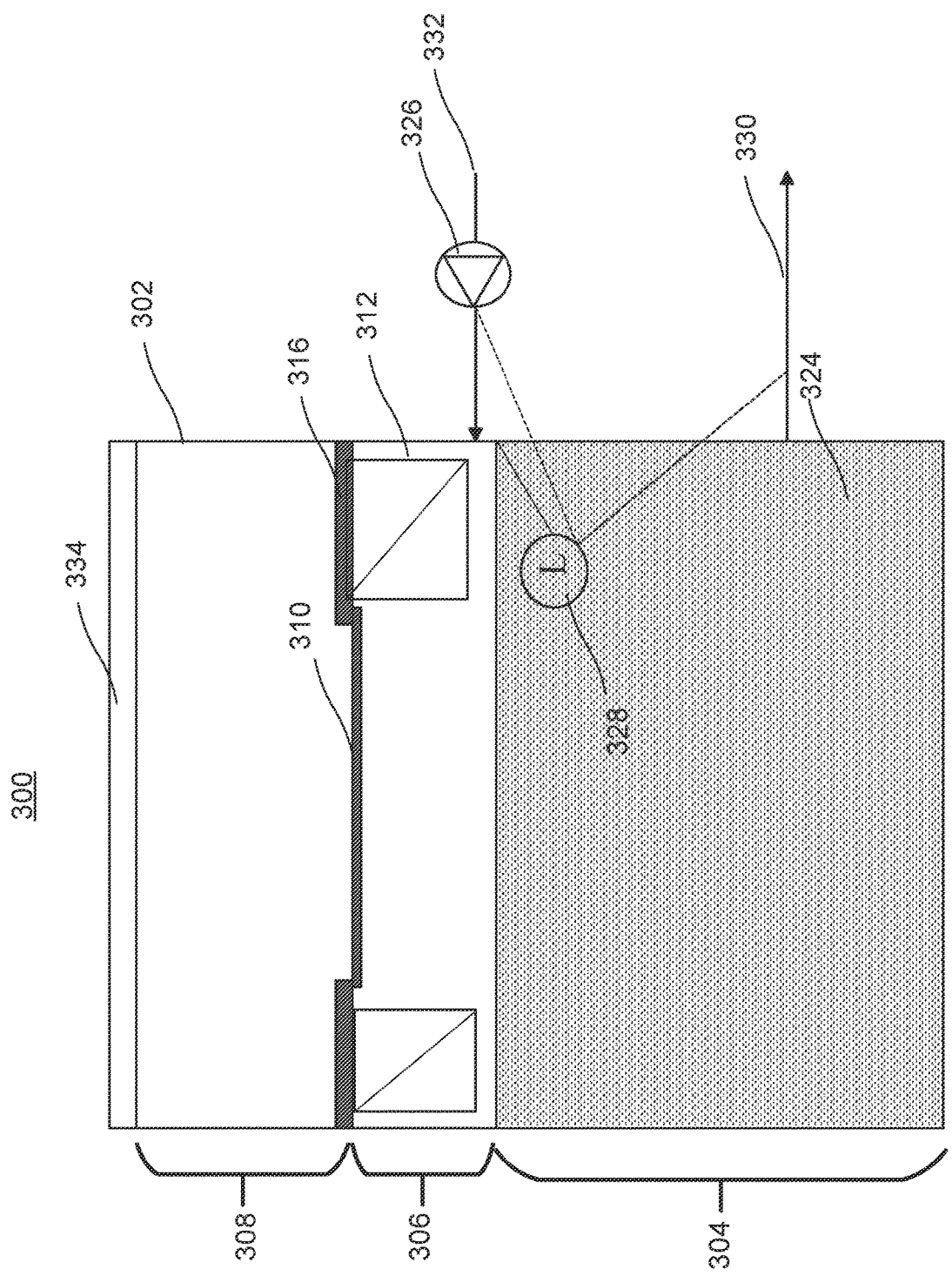
FIG. 3 is a block diagram illustrating side perspective view of another example of an immersion cooling system without a server blade installed according to one embodiment.

FIG. 3 is a block diagram illustrating side perspective view of another example of an immersion cooling system 300 without a server blade installed according to another embodiment. As shown, the container 302 may be separated by three regions: a fluid region 304, a vapor region 306, and an air region 308. Note that the lid 334 on top of the container 302 is closed and covers the top of the container 302.

In some embodiments, the container 302 further includes a fluid level sensor 328 positioned within the liquid region 304 and configured to measure a fluid level of the two-phase coolant 324 in the liquid region 304 for the purpose of maintaining a predefined fluid level.

In one embodiment, the container 302 also includes a pump 326 electrically connected to the fluid level sensor 328 and configured to receive a signal indicating the fluid level of the two-phase coolant 324 in the liquid region 304 from the fluid level sensor 328. Pump 326 may adjust its pump speed based on the fluid level of coolant 324. In one embodiment, a controller (not shown) may be deployed to receive the signal from the fluid level sensor 328 and to generate a control signal or command to control the pump speed of pump 326 based on the fluid level, so as to maintain the fluid level of the coolant.

As shown in FIG. 3, the container 302 additionally includes a return line 330 and a supply line 332 that are both coupled to the container 302. Supply line 332 is configured to supply or fill coolant into container 302 and return line is configured to remove or drain the coolant from container 302. In one embodiment, a pump is disposed on the supply line and/or the return line to help circulating the coolant. In this example, pump 326 is disposed on supply line 332. The pump 326 is configured to fill the liquid region 304 through the supply line 332 with the two-phase coolant 324 so as to maintain the predefined fluid level of the two-phase coolant 324 in the liquid region 304 based on the signal.

The cover panel 316 further includes a rotating lid 310 configured to cover the plurality of slots and to provide a sealed environment to the electronics when the rotating lid 310 is in a closed position. The rotating lid 310 is configured to be in an open position when the server blade is inserted into the liquid region through one of the plurality of slots. The cover panel 316 and a panel of the server blade provides the sealed environment to the electronics when the rotating lid 310 is in the open position. A condensing unit 312 may be positioned below the cover panel 316.

In this embodiment, a pump (e.g., 326) may be positioned for pumping in the two-phase coolant 324 into the liquid region 304. In addition, a pump 326 may be positioned on the return line 330 for pumping out the two-phase coolant 324 out of the liquid region 304. It should be noted that the fluid level sensor 328 is used to control the pump speed of pump 326 for controlling the fluid level of the two-phase coolant 324 in the liquid region 304. The pump 326 or known fluid moving device for moving fluid can be used with system 300. In some embodiments, a valve (not shown) may be used in place with the pump 326 in the system 300 for controlling and managing the fluid on this loop based on the actual operating requirement. In an embodiment, if the supply line 332 and the return line 330 are connected to a system with a central pump, the pump 326 and the return line 330 loop may be assembled with the valve (not shown) for controlling the movement of the two-phase coolant 324 in and out of the liquid region 304 within the container 302.

Figure 4A:
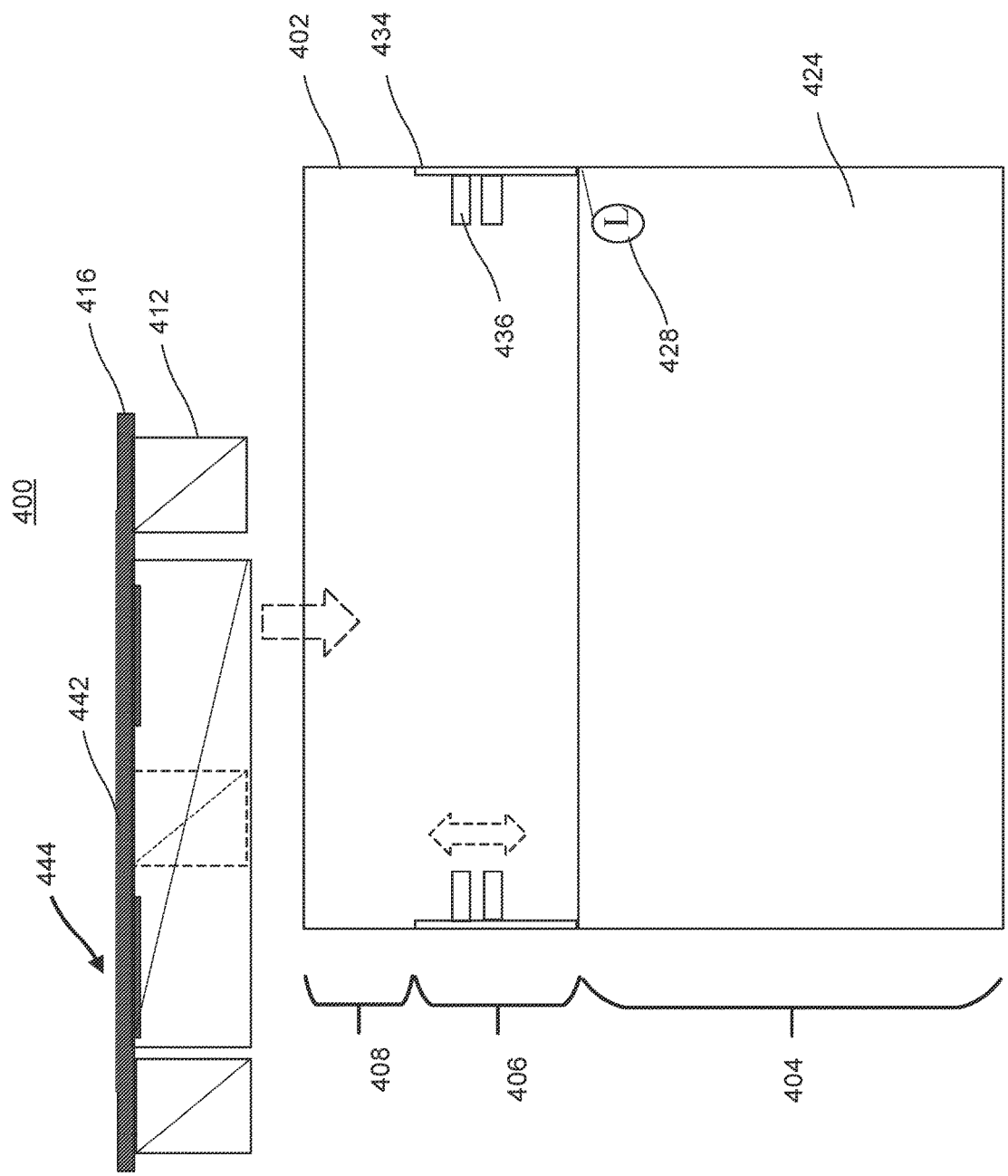
FIG. 4A is a block diagram illustrating side perspective view of another example of an immersion cooling system having an example of a condensing set to be installed according to one embodiment.

FIG. 4A is a block diagram illustrating side perspective view of another example of an immersion cooling system 400 having an example of a condensing set 444 to be installed according to another embodiment. As shown, a modular based condensing set 444 includes a panel 416, a condensing unit 412, and the rotation lid 442. In this embodiment, more condensing coils can be packaged in the condensing set 444.

In one embodiment, the container 402 further includes a mounting set having a first portion 434 positioned within the vapor region 406 and fixedly coupled to the container 402, and a second portion 436 coupled to the first portion 434 and adjustable along a longitudinal axis of the first portion 434. The second portion 436 is configured to support and lock the cover panel 416. The second portion 436 is adjusted to adjust a height of the vapor region 406. The variation in the condensing unit 412 height also enables to create an optimized vapor region 406 for the two phase recirculation and condensation.

FIG. 4B illustrates front perspective view of an example of a mounting set according to an embodiment. Referring to FIG. 4B, the first portion 434 of the mounting set may be configured to provide a base platform 438 for the second portion 436 of the mounting set to slide along the longitudinal axis (e.g., vertical direction) of the first portion 434 of the mounting set. Note the two sided arrow shows a sliding direction of the second portion 436 of the mounting set. In this manner, the second portion 436 of the mounting set can slide up or down along the base platform 438. The second portion 436 may include a structure to hold, secure, and fasten the cover panel 416 when the cover panel 416 is installed in the container 402, so that the cover panel 416 is not movable. For example, the second portion 436 may include a receptacle 440 that can receive the ends of the cover panel 416.

The second portion 436 may also include a lock mechanism to couple or decouple the cover panel 416 from the mounting set. For example, the lock mechanism may include a mechanical lock, a magnetic lock, or the like that may assist the coupling and uncoupling of the cover panel 416 from the mounting set. The mechanical lock can include a combination of a slot on a portion of the cover panel 416 and a movable hook disposed on the second portion 436. As a portion of the cover panel 416 is inserted into the second portion 436 of the mounting set, the movable hook can couple to the slot on the portion of the cover panel 416, thereby coupling the cover panel 416 and the second portion 436 of the mounting set. In this manner, the mounting set having a receptacle and a lock mechanism enables the cover panel 416 to be secured in a locked position. The top part of the second portion 436 is rotatable (shown in FIG. 5), and the bottom part of the second portion 436 is fixed.

Referring back to FIG. 4A, the mounting set is adjusted based on a height of the condensing unit 412 and the fluid level design within the container 402 to avoid the condensing unit 412 to be submerged in the two-phase coolant 424 when the cover panel 416 is installed in the container 402. This adjustable feature of the mounting set enables to optimize the vapor region for the phase change recirculation. The height of the condensing unit 412 can vary and therefore it requires the mounting set to be adjusted so that the condensing unit 412 is not submerged in the two-phase coolant 424. In this manner, the condensing unit 412 may be positioned within the vapor region 406. The height of the condensing height 412 can be adjusted using the mounting set described above. The second portion 436 of the mounting set can be adjusted based on the height of the condensing unit 412. The adjustable mounting set also allows the height of the vapor region 406 and the air region 408 to be adjusted for accommodating different server configurations, use, cases, etc. In this embodiment, the container 402 can also include a fluid level sensor 428 positioned within the liquid region 404 and configured to measure and identify a fluid level of the two-phase coolant 424 in the liquid region 404 and maintain a predefined fluid level.

The slots are spaced apart to provide a separation in space between the server blades. The slots may be arranged in a repeating manner or evenly on the server panel. Each slot may provide a space on the server panel into which a server blade or a condensing unit 412 is inserted. The number of plurality of slots can be varied and therefore a high density of server blades can be supported while providing a sufficient separation in space between the server blades.

Figure 5:
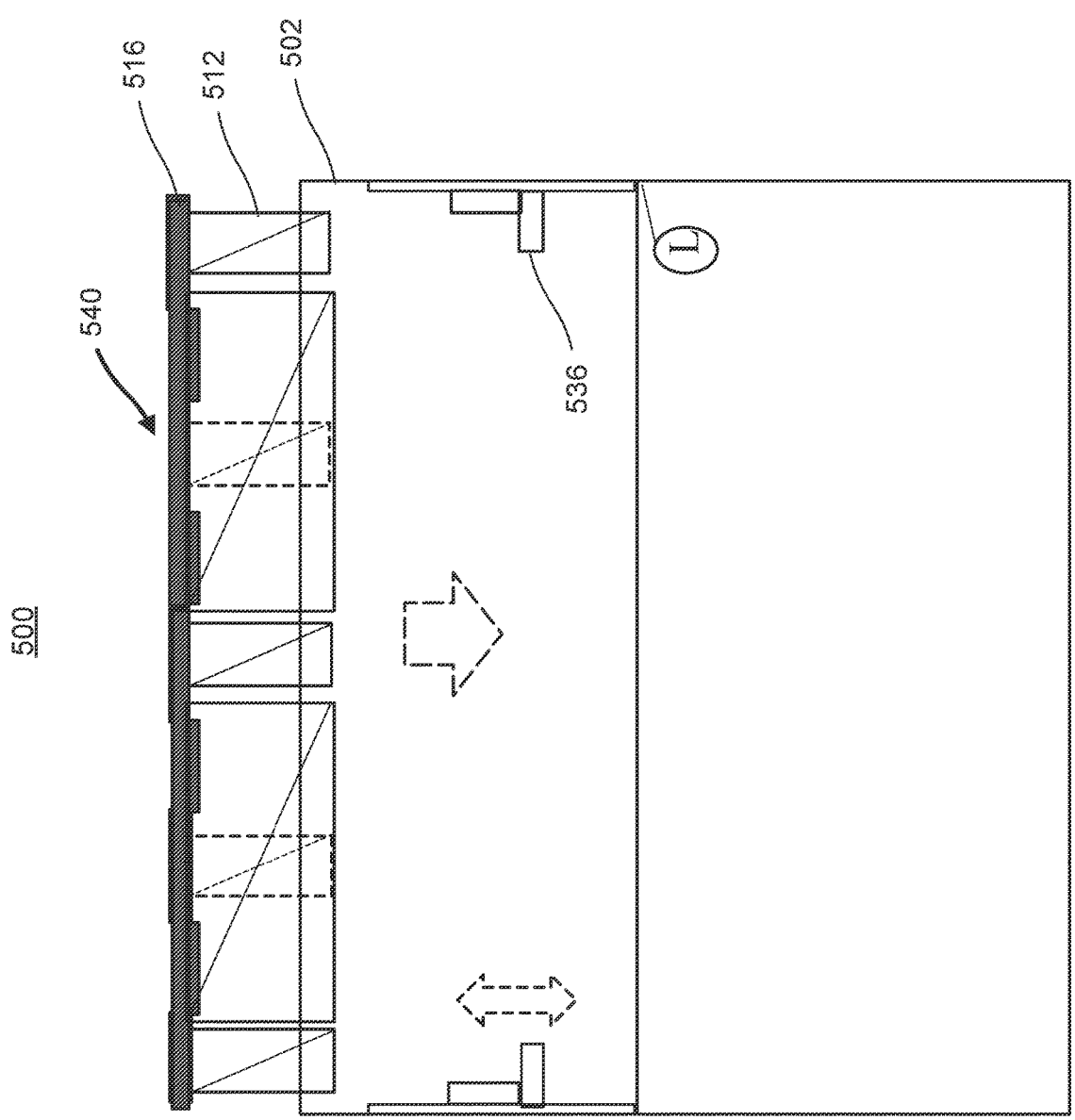
FIG. 5 is a block diagram illustrating side perspective view of another example of an immersion cooling system having another example of a condensing set to be installed according to one embodiment.

FIG. 5 is a block diagram illustrating side perspective view of another example of an immersion cooling system 500 having another example of a condensing set 540 to be installed according to another embodiment. As shown, the condensing set 540 includes a number of slots for receiving condensing units (e.g., 512) or server blades. This embodiment of condensing set 540 may accommodate different server configurations. The condensing sets can be adjusted and varied for different server blades such as (2U, 4U, 8U, etc.) to be populated within the same system 500. In addition, the condensing set 540 can be varied for a mixed server configuration. For example, the condensing set may accommodate U, 2U, and 4U servers in the system 500.

In one embodiment, the cover panel 516 further includes one or more central condensing units and one or more local condensing units (e.g., 512). In this embodiment, the second portion 536 of the mounting set may include an L-shape structure 536 on which the cover panel can be held, secured, and fastened when the cover panel 516 is installed in the container 502, so that the cover panel 516 is not movable.

Figure 6:
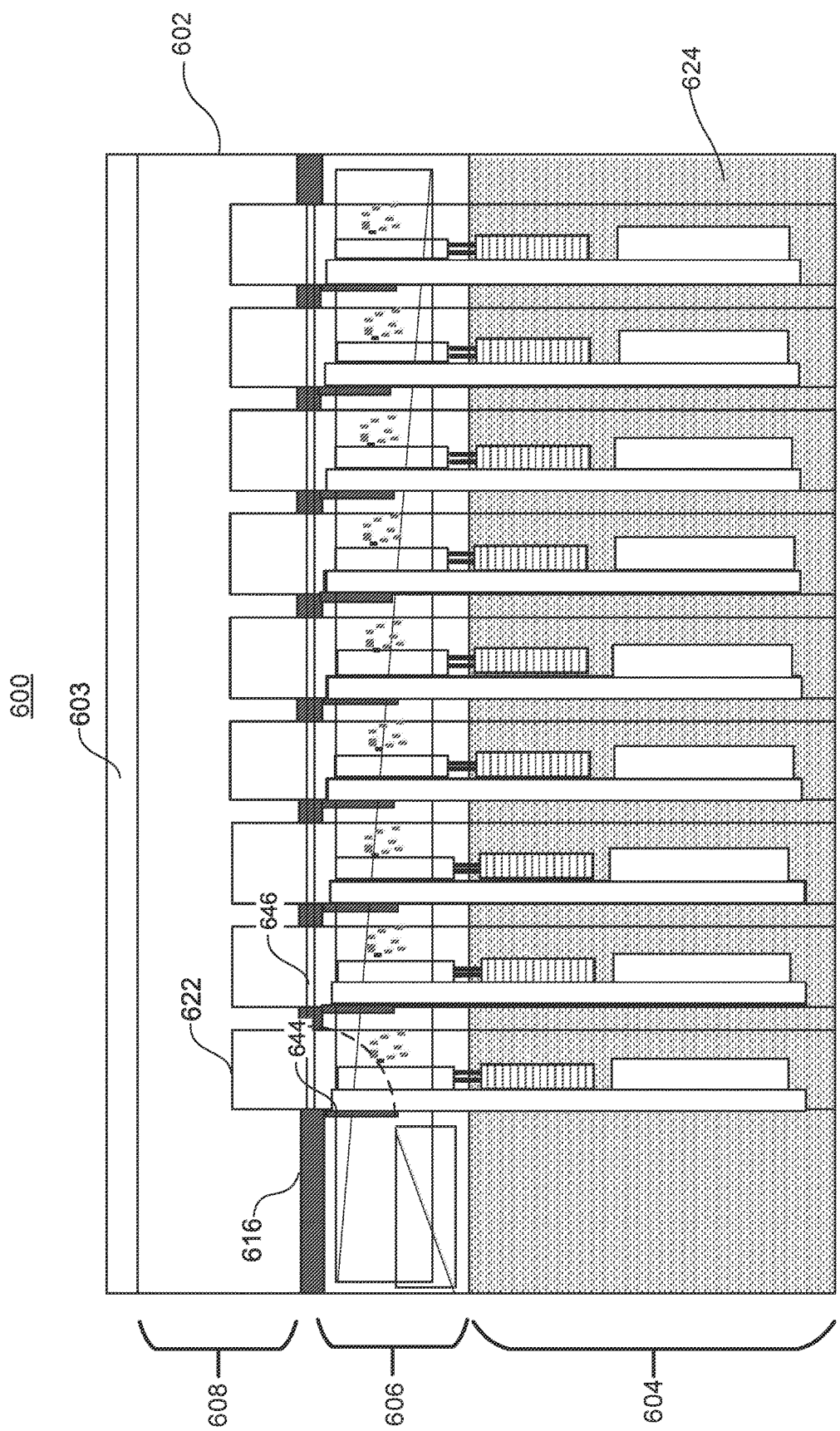
FIG. 6 is a block diagram illustrating side perspective view of another example of an immersion cooling system with a number of server blades installed through slots according to one embodiment.

FIG. 6 is a block diagram illustrating side perspective view of another example of an immersion cooling system 600 with a number of server blades installed through slots according to another embodiment. In FIG. 6, the system is fully deployed with a number of servers. As shown, the three regions (air 608, vapor 606, and liquid 604) are formed. A portion of the server blade 622 is partially submerged within the two-phase liquid 624 and a portion of the server blade 600 is partially exposed to vapor region 606. It should be appreciated that a number of condensing units are positioned at the surrounding locations underneath the cover panel 616.

Referring to FIG. 6, an immersion cooled IT system 600 may include a container 602 in which multiple server blades (e.g., 622) are individually installed. The container 602 may be a part of a data center. In this example, the container 602 is shown in side view, and includes multiple server blades (e.g., 622) installed within the container 602. Although a single container 602 is illustrated, container 602 may be one of a number of containers within the system 600 in a data center, for example. In FIG. 6, the container 602 may include a lid 603. Note that a data center may contain multiple immersion cooled IT systems 600 as shown in FIG. 6.

Each slot of cover panel 616 may include a rotating lid such as lid 644 configured to be either in an open or a closed position. In one embodiment, the rotating lid 644 may be in an open position when the server blade 622 is inserted into the liquid region 604 through one of the plurality of slots. As illustrated in FIG. 6, the rotating lid 644 is in an open position when the server blade 622 is inserted into the liquid region 604. The rotating lid 644 swings downwardly and is positioned parallel to the wall of the container 602 to allow the server blade 622 to be inserted into the slots. When the server blade 622 is removed from the container 602, the rotating lid 644 may return to the closed position.

In one embodiment, an elastic member such as a spring (not shown) may be in place around the axle of each lid. When the lid is in a closed position, the elastic member is in its neutral state. When a server blade or a condenser is inserted, it pushes the lid to swing open downwardly, which in turn compresses or stretches the elastic member. When the server blade or condenser is removed, the elastic member snaps back to its neutral state, which in turn causes the lid back to the closed position.

In the closed position, the rotating lid 644 may be in a horizontal position parallel to the cover panel 616. The cover panel 616 and a panel 646 of the server blade provides the sealed environment to the electronics when the rotating lid 644 is in the open position. When the rotating lid 644 is rotated as the server blade 622 is inserted through the slot, the panel 646 of the server blade continues to mate with the cover 616 to continuously segregate the vapor region 606 and the air region 608. In this manner, the vapor region 606 and the air region 608 continue to be segregated although the rotating lid 644 is in the open position.

Figure 7:
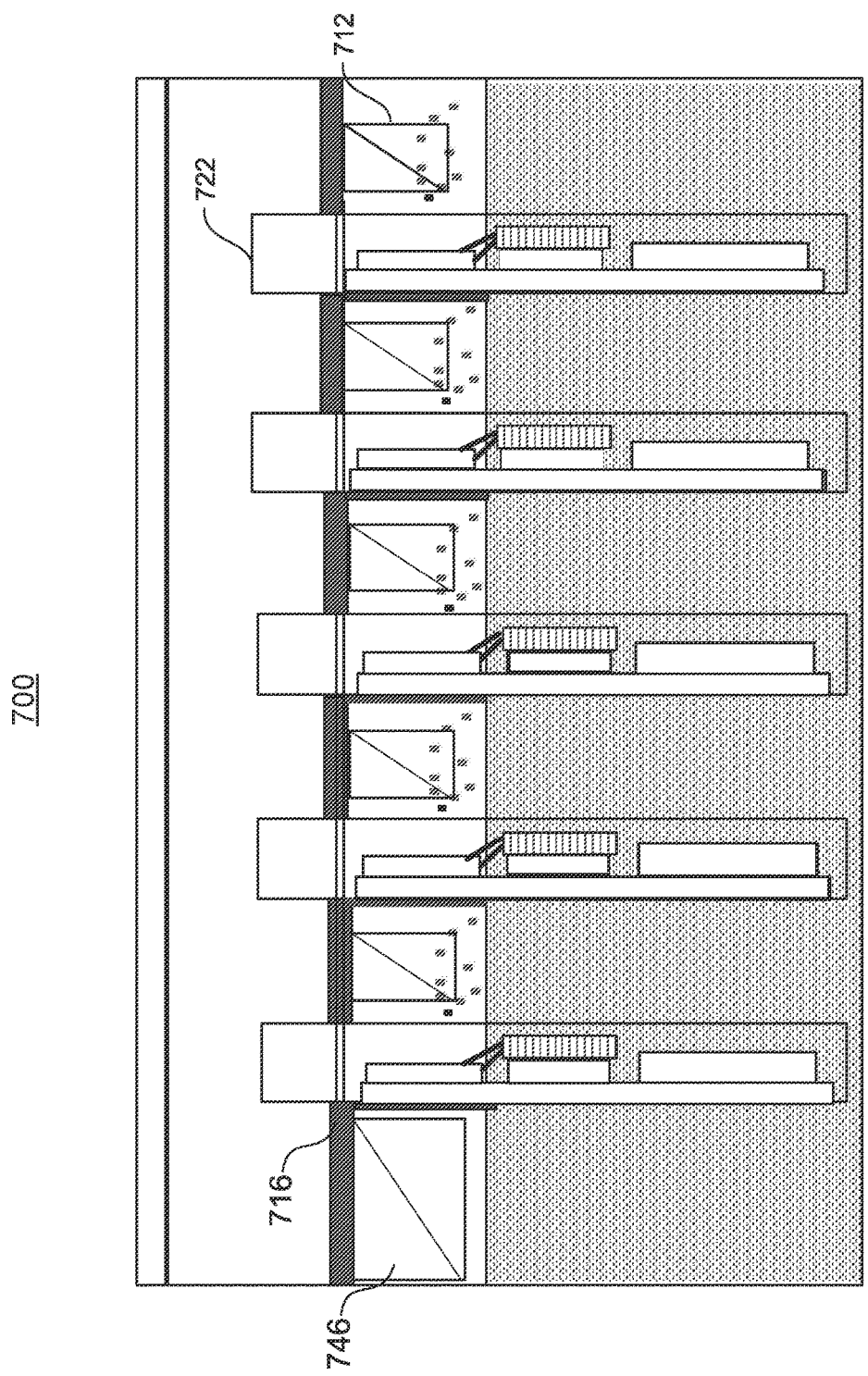
FIG. 7 is a block diagram illustrating side perspective view of another example of an immersion cooling system with a number of server blades installed and condensing units through slots according to one embodiment.

FIG. 7 is a block diagram illustrating side perspective view of another example of an immersion cooling system 700 with a number of server blades installed and condensing units through slots according to another embodiment. As shown, each server blade 722 is equipped with a corresponding condensing unit (e.g., 712). As shown in FIG. 7, the condensing units are prefabricated with the cover panel 716. The cover panel 716 may also include a central condensing unit 746 positioned below the cover panel 716. In one embodiment, condensing unit 712 is one of the localized condensing unit.

In one embodiment, the cover panel 716 includes a central condensing unit 746 attached below the cover panel and positioned within the vapor region. The cover panel 716 further includes the condensing unit 712 paired with the server blade 722.

Figure 8:
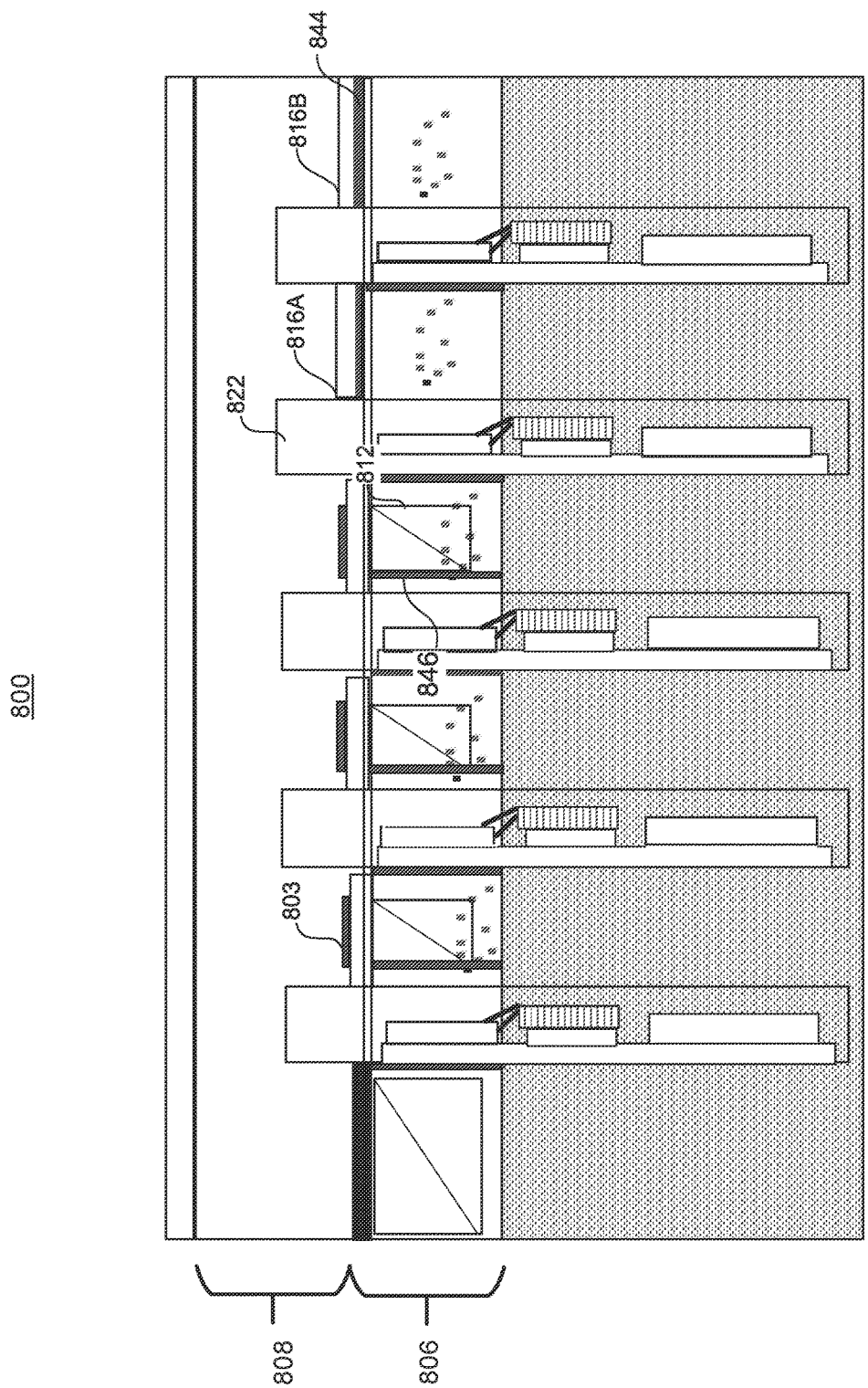
FIG. 8 is a block diagram illustrating side perspective view of another example of an immersion cooling system with a number of server blades and localized condensing units installed through slots according to one embodiment.

FIG. 8 is a block diagram illustrating side perspective view of another example of an immersion cooling system 800 with a number of server blades and localized condensing units installed through slots. Referring to FIG. 8, the panels (e.g., 816A-816B) located between the server blade locations can be configured as a base for a rotation lid. This may significantly increase the solution flexibility for varying and upgrading the condensing capability locally. As shown, the panels 816A-816B may not have any local condensing unit underneath them and the rotation lids 844 are in a closed position. The rest of the panels are populated with the condensing units (e.g., 812) while the associated rotation lids 846 are open. The condensing panel 803 may also function to keep the full separation regions of the air region 808 and vapor region 808. It is apparent that the solution is highly flexible and expandable for different use, case, and operation designs. The condensing unit 812 maybe inserted the same way as the server blade 822 is inserted through one or more slots. The condensing unit 812 may also include a panel that replaces the function of the rotating lid when the condensing unit 812 is inserted into the vapor region 806. In one embodiment, the condensing unit 812 includes a panel pushing a rotating lid 846 to open when the condensing unit 812 is inserted into the vapor region 816, thereby separating the air region 818 and the vapor region 816. The condensing unit 812 may be positioned in locations where the heat density is high.

As previously explained, an embodiment of the disclosure may be (or include) a non-transitory machine-readable medium (such as microelectronic memory) having stored thereon instructions, which program one or more data processing components (generically referred to here as a "processor") to perform cooling operations. In other embodiments, some of these operations might be performed by specific hardware components that contain hardwired logic. Those operations might alternatively be performed by any combination of programmed data processing components and fixed hardwired circuit components.

In the foregoing specification, embodiments of the disclosure have been described with reference to specific exemplary embodiments thereof. It will be evident that various modifications may be made thereto without departing from the broader spirit and scope of the disclosure as set forth in the following claims. The specification and drawings are, accordingly, to be regarded in an illustrative sense rather than a restrictive sense.

While certain aspects have been described and shown in the accompanying drawings, it is to be understood that such aspects are merely illustrative of and not restrictive on the broad disclosure, and that the disclosure is not limited to the specific constructions and arrangements shown and described, since various other modifications may occur to those of ordinary skill in the art. The description is thus to be regarded as illustrative instead of limiting.

In some aspects, this disclosure may include the language, for example, "at least one of [element A] and [element B]." This language may refer to one or more of the elements. For example, "at least one of A and B" may refer to "A," "B," or "A and B." Specifically, "at least one of A and B" may refer to "at least one of A and at least one of B," or "at least of either A or B." In some aspects, this disclosure may include the language, for example, "[element A], [element B], and/or [element C]." This language may refer to either of the elements or any combination thereof. For instance, "A, B, and/or C" may refer to "A," "B," "C," "A and B," "A and C," "B and C," or "A, B, and C."

What is claimed is:

1. An immersion cooling system, comprising:
    a container to receive one or more server blades that are at least partially submerged within a two-phase coolant contained within the container, each server blade having electronics therein, which when operate, generate heat to be transferred into the two-phase coolant thereby causing at least some of the two-phase coolant to turn into a vapor; and
    a cover panel to cover the container, wherein the container comprises:
        a liquid region defined to contain the two-phase coolant therein, and
        a vapor region defined between the cover panel and a surface of the two-phase coolant, wherein the cover panel includes a plurality of slots, wherein at least one of the slots is configured to allow a server blade to be inserted into the liquid region and at least partially submerged into the two-phase coolant, and wherein at least one of the slots is configured to allow a condensing unit to be inserted into the vapor region.

2. The immersion cooling system of claim 1, wherein the condensing unit is positioned and integrated below the cover panel and within the vapor region, the condensing unit being configured to condense the vapor back into the two-phase coolant.

3. The immersion cooling system of claim 1, wherein the container further comprises:
    a fluid level sensor positioned within the liquid region and configured to detect a fluid level of the two-phase coolant in the liquid region;
    a pump coupled to the fluid level sensor to supply the two-phase coolant based on the fluid level of the two-phase coolant to maintain a predefined fluid level; and
    a return line and a supply line that are both coupled to the container, wherein the pump is configured to release the two-phase coolant through the return line to fill the liquid region through the supply line with the two-phase coolant so as to maintain the predefined fluid level of the two-phase coolant in the liquid region.

4. The immersion cooling system of claim 1, wherein the cover panel further includes a rotating lid configured to cover the plurality of slots and provide a sealed environment to the electronics when the rotating lid is in a closed position, wherein the rotating lid is configured to be in an open position when the server blade is inserted into the liquid region through one of the plurality of slots, wherein the cover panel and a panel of the server blade provides the sealed environment to the electronics when the rotating lid is in the open position.

5. The immersion cooling system of claim 1, wherein the condensing unit includes a panel pushing a rotating lid to open when the condensing unit is inserted into the vapor region, thereby separating the vapor region and an air region.

6. The immersion cooling system of claim 1, wherein the container further comprises:
    a mounting set comprising:
        a first portion positioned within the vapor region and fixedly coupled to the container, and
        a second portion coupled to the first portion and adjustable along a longitudinal axis of the first portion, the second portion being configured to hold and lock the cover panel, wherein the second portion is adjusted to adjust a height of the vapor region.

7. The immersion cooling system of claim 6, wherein the mounting set is adjusted based on a height of the condensing unit to avoid the condensing unit to be submerged in the two-phase coolant when the cover panel is installed in the container.

8. The immersion cooling system of claim 1, wherein the plurality of slots is configured to provide a separation in space between the server blade.

9. The immersion cooling system of claim 1, wherein the cover panel further includes one or more central condensing units and one or more local condensing units.

10. The immersion cooling system of claim 1, wherein the cover panel includes a central condensing unit attached below the cover panel and positioned within the vapor region, and wherein the cover panel further includes the condensing unit paired with the server blade.

11. A data center, comprising:
    a plurality of containers, wherein each of the containers is configured to receive one or more server blades that are at least partially submerged within a two-phase coolant contained within the container, each server blade having electronics therein, which when operate, generate heat to be transferred into the two-phase coolant thereby causing at least some of the two-phase coolant to turn into a vapor; and
    a cover panel to cover the container, wherein each container comprises:
        a liquid region defined to contain the two-phase coolant therein, and
        a vapor region defined between the cover panel and a surface of the two-phase coolant, wherein the cover panel includes a plurality of slots, wherein at least one of the slots is configured to allow a server blade to be inserted into the liquid region and at least partially submerged into the two-phase coolant, and wherein at least one of the slots is configured to allow a condensing unit to be inserted into the vapor region.

12. The data center of claim 11, wherein the condensing unit is positioned and integrated below the cover panel and within the vapor region, the condensing unit being configured to condense the vapor back into the two-phase coolant.

13. The data center of claim 11, wherein the container further comprises:
    a fluid level sensor positioned within the liquid region and configured to detect a fluid level of the two-phase coolant in the liquid region;

a pump coupled to the fluid level sensor to supply the two-phase coolant based on the fluid level of the two-phase coolant to maintain a predefined fluid level; and a return line and a supply line that are both coupled to the container, wherein the pump is configured to release the two-phase coolant through the return line to fill the liquid region through the supply line with the two-phase coolant so as to maintain the predefined fluid level of the two-phase coolant in the liquid region.

14. The data center of claim 11, wherein the cover panel further includes a rotating lid configured to cover the plurality of slots and provide a sealed environment to the electronics when the rotating lid is in a closed position, wherein the rotating lid is configured to be in an open position when the server blade is inserted into the liquid region through one of the plurality of slots, wherein the cover panel and a panel of the server blade provides the sealed environment to the electronics when the rotating lid is in the open position.

15. The data center of claim 11, wherein the condensing unit includes a panel pushing a rotating lid to open when the condensing unit is inserted into the vapor region, thereby separating the vapor region and an air region.

16. The data center of claim 11, wherein the container further comprises:

a mounting set comprising:
a first portion positioned within the vapor region and fixedly coupled to the container, and
a second portion coupled to the first portion and adjustable along a longitudinal axis of the first portion, the second portion being configured to hold and lock the cover panel, wherein the second portion is adjusted to adjust a height of the vapor region.

17. The data center of claim 16, wherein the mounting set is adjusted based on a height of the condensing unit to avoid the condensing unit to be submerged in the two-phase coolant when the cover panel is installed in the container.

18. The data center of claim 11, wherein the plurality of slots is configured to provide a separation in space between the server blade.

19. The data center of claim 11, wherein the cover panel further includes one or more central condensing units and one or more condensing units.

20. The data center of claim 11, wherein the cover panel includes a central condensing unit attached below the cover panel and positioned within the vapor region, and wherein the cover panel further includes the condensing unit paired with the server blade.

* * * * *